United States Patent [19]
Shibuya et al.

[11] Patent Number: 5,485,352
[45] Date of Patent: Jan. 16, 1996

[54] ELEMENT JOINING PAD FOR SEMICONDUCTOR DEVICE MOUNTING BOARD

[75] Inventors: Akinobu Shibuya; Mitsuru Kimura, both of Tokyo, Japan

[73] Assignee: NEC Corporation, Japan

[21] Appl. No.: 358,196

[22] Filed: Dec. 16, 1994

[30] Foreign Application Priority Data

Dec. 27, 1993 [JP] Japan ................................. 5-330278

[51] Int. Cl.$^6$ ........................................ H05K 1/09
[52] U.S. Cl. ...................... 361/771; 174/257; 174/260; 361/767
[58] Field of Search ................................ 361/771, 767; 174/257, 260, 261

[56] References Cited

U.S. PATENT DOCUMENTS

| | | | |
|---|---|---|---|
| 4,081,601 | 3/1978 | Dinella et al. | 174/68.5 |
| 4,549,043 | 10/1985 | Kalubowila et al. | 174/133 R |
| 4,959,510 | 9/1990 | Matsusaka et al. | 174/261 |
| 5,384,204 | 1/1995 | Yumoto et al. | 428/626 |
| 5,400,221 | 3/1995 | Kawaguchi | 361/771 |

FOREIGN PATENT DOCUMENTS

| | | |
|---|---|---|
| 62-8533 | 1/1987 | Japan . |
| 2-88471 | 3/1990 | Japan . |
| 4-101489 | 4/1992 | Japan . |

*Primary Examiner*—Laura Thomas
*Attorney, Agent, or Firm*—Laff, Whitesel, Conte & Saret, Ltd.

[57] ABSTRACT

An element joining pad for a semiconductor device mounting board includes a thick-film metalized layer, a barrier layer, and a Ni plating layer. The thick-film metalized layer is selectively formed on a low-temperature sintered board and consists of one of a metal and an alloy which can be sintered at 500° C. or more and 1,200° C. or less. The barrier layer is formed on the thick-film metalized layer and constituted by one of a Rh plating layer and a Ru plating layer. The Ni plating layer is formed on the barrier layer.

9 Claims, 3 Drawing Sheets

ELEMENT JOINING PAD FOR SEMICONDUCTOR DEVICE MOUNTING BOARD

BACKGROUND OF THE INVENTION

The present invention relates to a joining structure for a semiconductor device such as an LSI mounted on a multi-layered wiring board, a thick-film multilayered board, a semiconductor package, an insulating board using a glass-ceramic, or the like and, more particularly, to the structure of an element joining pad formed on a semiconductor device mounting board.

FIG. 3 shows a conventional joining pad of a metalized arrangement formed on a semiconductor device mounting board. A metalized layer on a mounting board is generally constituted by a thin film. The joining pad shown in FIG. 3 is constituted by a Cr sputtered film 8 selectively formed on a glass-ceramic board 7, and a Pd sputtered film 9 formed on the Cr sputtered film 8. When a thin-film metalized layer is used, although a residual stress which is generated by forming the metalized layer and acts on a board can be suppressed, the cost increases. FIG. 4 shows a case wherein an I/O pin is joined on a metalized arrangement. Referring to FIG. 4, an I/O pin 6 consisting of Kovar is joined by an Au—Sn brazing alloy 10 on the metalizing arrangement (FIG. 3) constituted by the Cr sputtered film 8 and the Pd sputtered film 9. In this manner, as a conventional brazing material used in a thin-film metalized layer, a material such as an Au—Sn-based alloy having a melting point of 300° C. or less is often used. However, the Au—Sn alloy is expensive, and a temperature in the processes after the I/O pin 6 is joined is disadvantageously limited to the low temperature of the Au—Sn alloy due to its low melting point. In addition, when a brazing material having a melting point of 500° C. or more, and particularly, 700° C. or more is used, the brazing material and the metalizing material are diffused to each other, and a stress generated during a brazing operation disadvantageously peels a metalized film or breaks a board.

In order to solve this problem, in a conventional alumina or aluminum nitride board 11, as shown in FIG. 5, after a Ni plating layer 4 is formed on a thick-film tungsten metalized layer 12 formed on a board, an I/O pin 6 consisting of Kovar is joined to the Ni plating layer 4 with a Ag—Cu-based eutectic brazing material 5. However, in order to form the thick-film tungsten metalized layer 12, a process temperature must be set to be 1,500° C. or more. For this reason, the same technique as described above cannot be applied to a glass-ceramic board which can be advantageously sintered at a low temperature.

A thick-film metalized layer is applied to a low-temperature sintered glass-ceramic board such that, as shown in FIG. 6, after the Ni plating layer 4 is formed on the thick-film Cu-metalized layer 13 formed on the glass-ceramic board 7, the I/O pin 6 consisting of Kovar is joined to the Ni plating layer 4 with the Ag—Cu-based material 5. However, in this case, the material of the thick-film Cu-metalized layer 13, the material of the Ni plating layer 4, and the Ag—Cu brazing material 5 are completely diffused to each other, so that a satisfactory joining strength cannot be obtained. In addition, when the portion of the thick-film Cu-metalized layer 13 consists of Ag or a Ag—Pd-based alloy, the diffusion can be suppressed. However, when the I/O pin 6 is joined to the Ni plating layer 4 with the Ag—Cu-based eutectic brazing material, the thick-film metalized layer 13 is disadvantageously peeled.

Applying a high-temperature brazing material to a glass-ceramic board is reported in Japanese Patent Laid-Open No. 2-88471. This technique is associated with a joining operation between the glass-ceramic board and an AlN board. According to the technique, the strength of a metalized layer is increased such that an intermediate layer consisting of glass and a metal is formed on a metalized portion consisting of glass-ceramic. However, when an I/O pin or the like is joined to the metalized layer, a satisfactory strength cannot be obtained.

As described above, a metalizing structure and a joining structure on a low-temperature sintered board, and particularly, a glass-ceramic board cannot join the board to a metal at a low cost and a high strength, and cannot obtain a joining member having a heat resistance of 500° C. or more and constituted by a joining pad and a metal.

SUMMARY OF THE INVENTION

It is an object of the present invention to provide a joining pad, for a semiconductor device mounting board, which can be manufactured at a low cost and joined to an I/O pin at a high strength.

It is another object of the present invention to provide an element joining pad, for a semiconductor device mounting board, which can be applied on a semiconductor device mounting board having a heat resistance of 500° C. or more.

In order to achieve the above objects, according to the present invention, there is provided an element joining pad for a semiconductor device mounting board, comprising a thick-film metalized layer selectively formed on a low-temperature sintered board and consisting of one of a metal and an alloy which can be sintered at not less than 500° C. and not more than 1,200° C., a barrier layer formed on the thick-film metalized layer and constituted by one of a Rh plating layer and a Ru plating layer, and a Ni plating layer formed on the barrier layer.

DESCRIPTION OF THE PREFERRED EMBODIMENT

Figure 1:
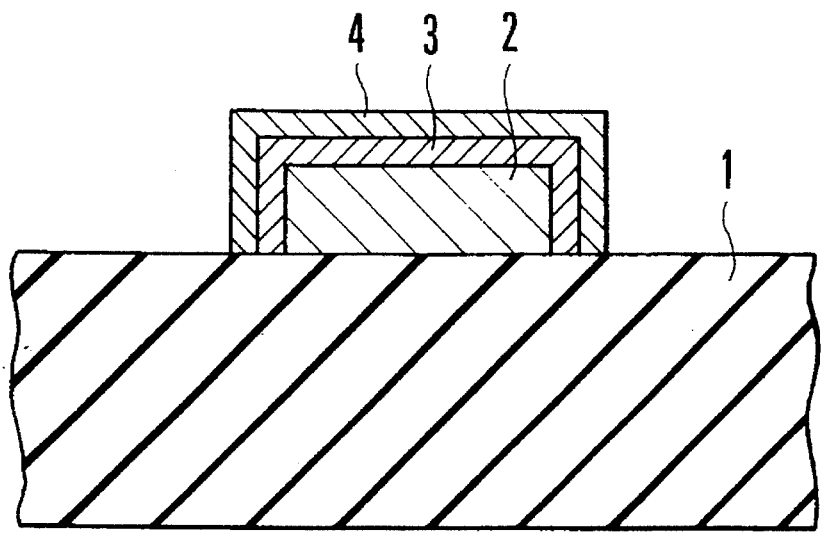
FIG. 1 is a view showing the structure of an element joining pad for a semiconductor device mounting board according to the present invention.

FIG. 1 shows the arrangement of an element pad according to the present invention. The element joining pad shown in FIG. 1 is constituted by a thick-film metalized layer 2 selectively formed on a semiconductor device mounting board 1, a Rh or Ru plating layer 3 serving as a barrier layer formed on the thick-film metalized layer 2, and a Ni plating layer 4 formed on the Rh or Ru plating layer 3. As the low-temperature sintered mounting board 1 which can be sintered at a temperature of about 1,100° C. or less, a glass-ceramic board or a thick-film multilayered board is used. The composition of the mounting board 1 is not limited to any specific one, and variable materials can be applied as the material of the mounting board 1. In addition, the conductive material used in the board 1 is not limited to a specific one. The thick-film metalized layer 2 desirably consists of a metal or alloy such as Ag, Ag—Pd, Cu, or Au which is sintered at 500° C. or more and 1,200° C. or less, and preferably, 700° C. or more and 950° C. or less. However, the material of the thick-film metalized layer 2 is not limited to the above materials. As a method of forming a thick film, either of a post-firing method or a co-firing method is preferably used.

As a method of forming the Rh or Ru plating layer 3 and the Ni plating layer 4, an electroless plating method or an electrolytic plating method is properly selected. A technique that a Rh plating or Ru plating effectively operates as a barrier for preventing Ni diffusion is known in Japanese Patent Laid-Open No. 62-8533 or the like. However, in addition to the above effect, the following effect has been apparent. That is, when the Rh or Ru plating layer 3 is used in this joining structure, the Rh or Ru plating layer 3 not only operates as a barrier for preventing the Ni plating layer 4 and the thick-film metalized layer 2 from being diffused to each other during a brazing operation but also suppresses stress transmission from a brazing material to the thick-film metalized layer 2 because peeling or the like of the thick-film metalized layer 2 does not occur during the brazing operation. Since Rh or Ru has a high hardness and a small thermal expansion coefficient, deformation of the Rh or Ru plating layer 3 is suppressed even when the brazing material is deformed. Therefore, it is understood that the effect of suppressing stress transmission to the thick-film metalized layer 2 is obtained.

Since the Ni plating layer 4 contributes to an improvement of wettability of a Ag—Cu-based alloy or the like, as will be described below, a joining member constituted by a metal or an alloy and a mounting board such as a high-strength glass-ceramic mounting board using a brazing material having a melting point of 500° C. or more, and particularly, 700° C. or more can be obtained. Therefore, it is understood that the degree of freedom of temperature control in the sequential processes increases.

Figure 2:
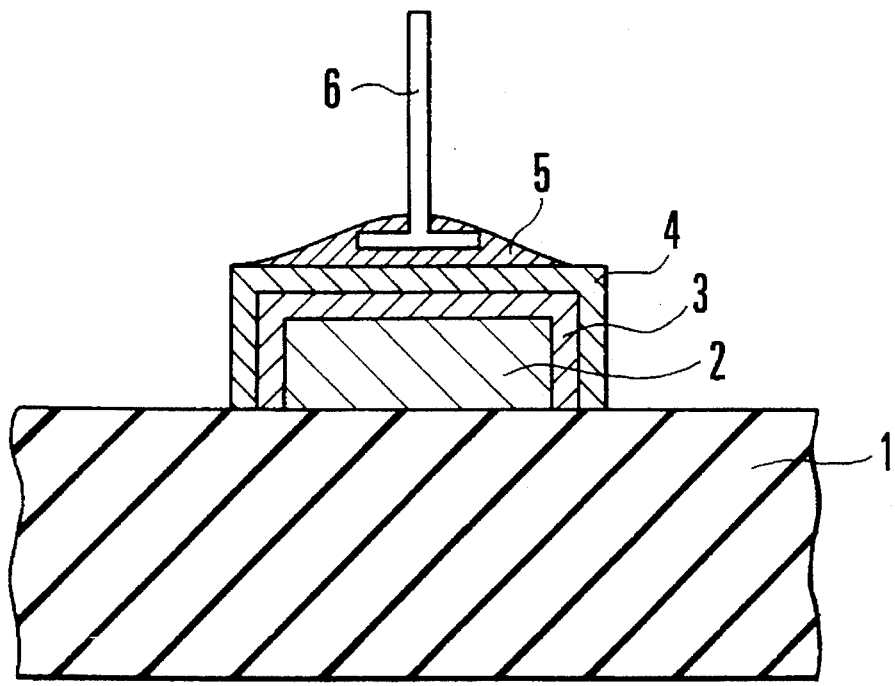
FIG. 2 is a view showing the structure of a joining pad having an I/O pin according to the present invention.
Figure 3:
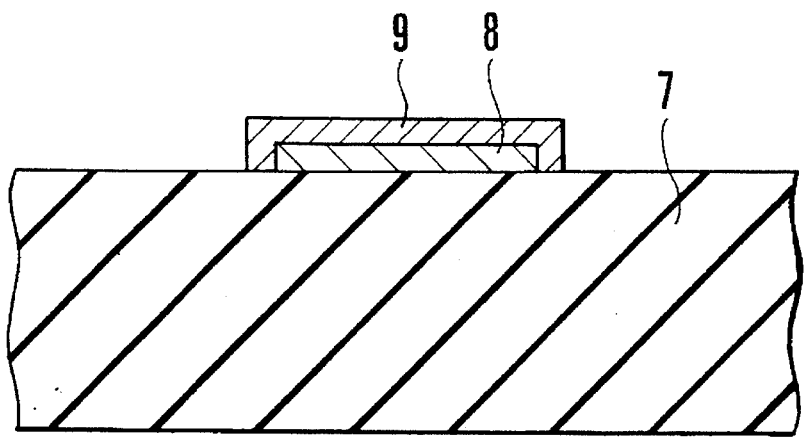
FIG. 3 is a view showing a conventional thin-film metalizing structure.
Figure 4:
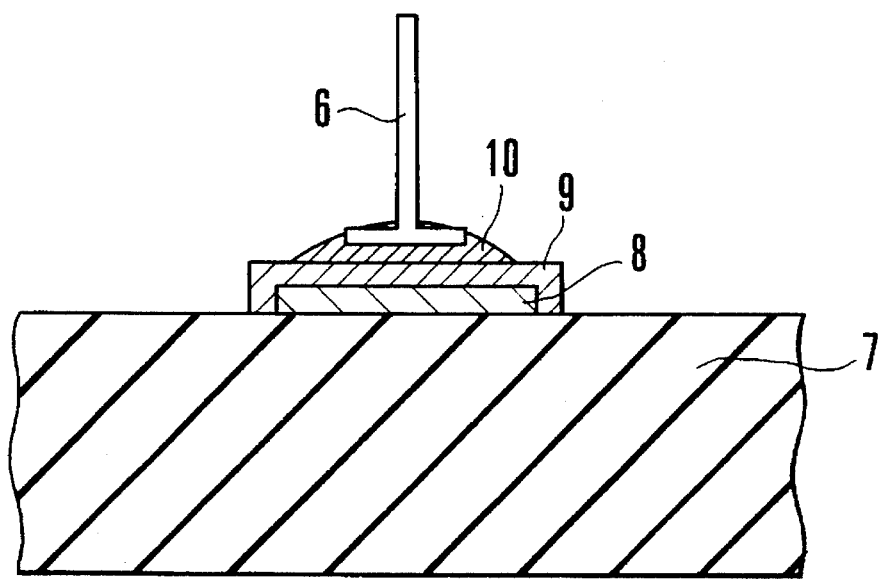
FIG. 4 is a view showing a conventional thin-film metalizing structure having an I/O pin.
Figure 5:
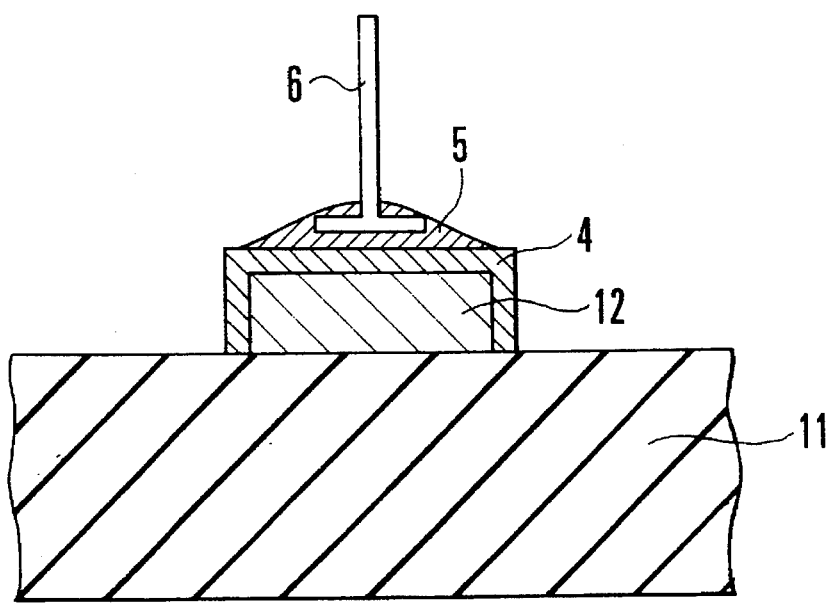
FIG. 5 is a view showing a conventional pad structure for a high-temperature sintered board.
Figure 6:
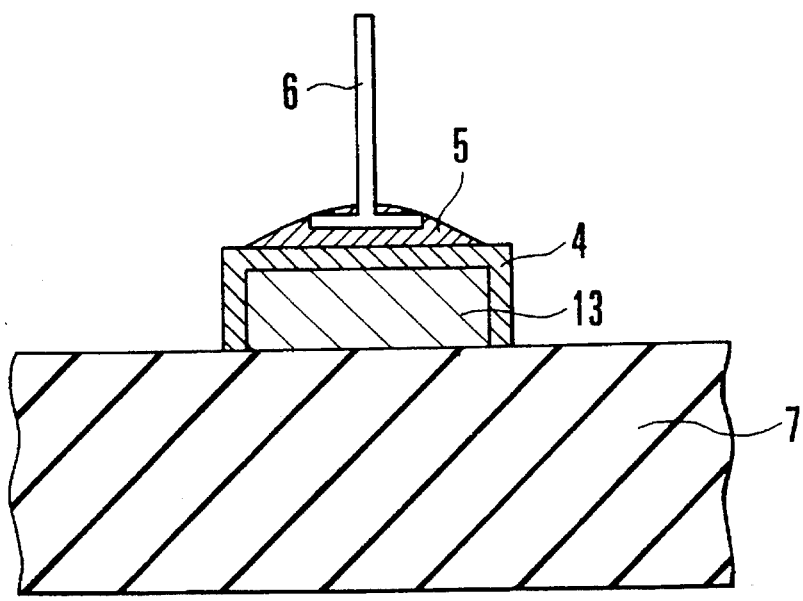
FIG. 6 is a view showing a conventional pad structure for a low-temperature sintered board.

FIG. 2 shows a case wherein an I/O pin 6 consisting of an alloy, e.g., Kovar, is joined to the element joining pad of FIG. 1 with a Ag—Cu brazing material 5. The material and shape of the part to be joined are not limited. In addition, although a Ag—Cu-based eutectic alloy having a melting point of 700° C. or more is suitably used as the brazing material, an Au—Si-based alloy, Au—Ge-based alloy, an Au—Cu-based alloy, an Al—Si-based alloy, a Cu—Zn-based alloy, a Ni—Cr-based alloy, an Mg—Al-based alloy, or the like may be used as the brazing material. Any material having a melting point of 500° C. or more and a temperature (1,000° C. or less) at which the metalizing layer or the like is not melted may be used as the brazing material. In addition, when the element pad and the joined alloy or metal are plated with Ni/Au or the like after the joining operation is completed, joining properties and a corrosion resistance in the sequential processes are improved.

In addition, according to the present invention, since an expensive thin-film process and a high-cost Au—Sn-based alloy are not used, an element joining pad can be manufactured at a low cost.

Examples obtained by variously changing the compositions of a board, a wiring layer, and a metalized layer to be used in FIGS. 1 and 2 and the composition of a plating layer on the metalized layer will be described below.

(EXAMPLE 1)

On a multilayered wiring glass-ceramic board 1 using Cu as an internal conductor, consisting of borosilicate glass and alumina, and sintered at 1,000° C., a thick-film Cu-metalized layer 2 was formed by a post-firing method at 900° C. Thereafter, a Ru plating layer 3 and a Ni plating layer 4 were sequentially formed by electroless plating. In addition, an I/O pin 6 consisting of Kovar was joined to the Ni plating layer 4 with a Ag—Cu-based eutectic brazing material 5 at 780° C. The pull-off strength of the I/O pin 6 at an angle of 45° is shown in Table 1. As is apparent from Table 1, the joining strength of the I/O pin 6 has a satisfactory value.

(EXAMPLE 2)

Following the same procedures as in Example 1, a thick-film Cu-metalized layer 2, a Ru plating layer 3, and a Ni plating layer 4 were formed on a Cu multilayered wiring glass-ceramic board 1, and an I/O pin 6 consisting of Kovar was joined to the Ni plating layer 4 with a Ag—Cu-based eutectic brazing material 5. The joining strength of the I/O pin 6 is shown in Table 1. As is apparent from Table 1, the joining strength of the I/O pin 6 has a satisfactory value.

(EXAMPLE 3)

On a thick-film multilayered board 1 using Cu as an internal conductor and containing borosilicate glass as a main component, a thick-film Cu-metalized layer 2 was formed at 850° C. Thereafter, a Ru plating layer 3 and a Ni plating layer 4 were formed by electroless plating. In addition, an I/O pin 6 consisting of Kovar was joined to the Ni plating layer 4 with a Ag—Cu-based eutectic brazing material 5. The joining strength of the I/O pin 6 is shown in Table 1. As is apparent from Table 1, the joining strength of the I/O pin 6 has a satisfactory value.

(EXAMPLE 4)

Following the same procedures as in Example 3, a thick-film Cu-metalized layer 2, a Ru plating layer 3, and a Ni plating layer 4 were formed on a Cu-wiring thick-film multilayered board 1, and an I/O pin 6 consisting of Kovar was joined to the Ni plating layer 4 with a Ag—Cu-based eutectic brazing material 5. The joining strength of the I/O pin 6 is shown in Table 1. As is apparent from Table 1, the joining strength of the I/O pin 6 has a satisfactory value.

(EXAMPLE 5)

On a multilayered wiring glass-ceramic board 1 using Ag as an internal conductor, consisting of borosilicate glass and alumina, and sintered at 900° C., a thick-film Ag—Pd-metalized layer 2 was formed by a post-firing method at 850° C. Thereafter, a Ru plating layer 3 and a Ni plating layer 4 were formed by electroless plating. In addition, an I/O pin 6 consisting of Kovar was joined to the Ni plating layer 4 with a Ag—Cu-based eutectic brazing material 5. The joining strength of the I/O pin 6 is shown in Table 1. As is apparent from Table 1, the joining strength of the I/O pin 6 has a satisfactory value.

(EXAMPLE 6)

Following the same procedures as in Example 5, a thick-film Ag—Pd-metalized layer 2, a Ru plating layer 3, and a Ni plating layer 4 were formed on a multilayered Ag-wiring glass-ceramic board 1, and an I/O pin 6 consisting of Kovar was joined to the Ni plating layer 4 with a Ag—Cu-based eutectic brazing material 5. The joining strength of the I/O pin 6 is shown in Table 1. As is apparent from Table 1, the joining strength of the I/O pin 6 has a satisfactory value.

(EXAMPLE 7)

On a thick-film multilayered board 1 using Ag as an internal conductor, a thick-film Ag—Pd-metalized layer 2 was formed at 800° C. Thereafter, a Ru plating layer 3 and a Ni plating layer 4 were sequentially formed by electroless plating. In addition, an I/O pin 6 consisting of Kovar was joined to the Ni plating layer 4 with a Ag—Cu-based eutectic brazing material 5. The joining strength of the I/O pin 6 is shown in Table 1. As is apparent from Table 1, the joining strength of the I/O pin 6 has a satisfactory value.

(EXAMPLE 8)

Following the same procedures as in Example 7, a thick-film Ag—Pd-metalized layer 2, a Ru plating layer 3, and a Ni plating layer 4 were formed on a Ag-wiring thick-film multilayered board 1, and an I/O pin 6 consisting of Kovar was joined to the Ni plating layer 4 with a Ag—Cu-based eutectic brazing material 5. The joining strength of the I/O pin 6 is shown in Table 1. As is apparent from Table 1, the joining strength of the I/O pin 6 has a satisfactory value.

(Comparative Example 1)

On a multilayered wiring glass-ceramic board using Cu as an internal wiring material and consisting of borosilicate glass and alumina, an element joining pad consisting of Cr and Pd was formed by sputtering. Thereafter, an I/O pin consisting of Kovar was joined to the element joining pad with an Au—Sn-based eutectic brazing material at 300° C. The joining strength of the I/O pin is shown in Table 1. Although this joining strength is usable, the joining strength is lower than that of the present invention. In addition, the following problems are posed. In Comparative Example 1, the cost is high, and a temperature in the sequential processes is disadvantageously limited to 280° C. or less.

(Comparative Example 2)

On a multilayered wiring glass-ceramic board using Ag as an internal wiring material, an element joining pad consisting of Cr and Pd was formed by sputtering. Thereafter, an I/O pin consisting of Kovar was joined to the element joining pad with an Au—Sn-based eutectic brazing material. The joining strength of the I/O pin is shown in Table 1. As in Comparative Example 1, a cost and a temperature in the sequential processes pose problems.

(Comparative Example 3)

On a multilayered wiring glass-ceramic board using Cu as an internal wiring material, a thick-film Cu-metalized layer was formed by a post-firing method. Thereafter, a Ni plating layer was formed by electroless plating. In addition, an I/O pin consisting of Kovar was joined to the Ni plating layer with a Ag—Cu-based eutectic brazing material. The joining strength of the I/O pin is shown in Table 1. The thick-film Cu-metalizing material, a Ni plating material, and a Ag—Cu-based eutectic brazing material were diffused to each other, and a very low joining strength was obtained.

(Comparative Example 4)

On a multilayered wiring glass-ceramic board using Ag as an internal wiring material, a thick-film Ag—Pd-metalized layer was formed by a post-firing method. Thereafter, a Ni plating layer was formed by electroless plating. In addition, an I/O pin consisting of Kovar was joined to the Ni plating layer with a Ag—Cu-based eutectic brazing material. The joining strength of the I/O pin is shown in Table 1. Peeling of the thick-film Ag—Pd-metalized portion occurred during the joining operation of the I/O pin.

TABLE 1

| | Board | Wiring | Metalized Layer | Plating Layer |
| --- | --- | --- | --- | --- |
| Example 1 | glass-ceramic | Cu | thick-film Cu | Rh/Ni |
| Example 2 | glass-ceramic | Cu | thick-film Cu | Ru/Ni |
| Example 3 | thick-film multilayer | Cu | thick-film Cu | Rh/Ni |
| Example 4 | thick-film multilayer | Cu | thick-film Cu | Ru/Ni |
| Example 5 | glass-ceramic | Ag | thick-film Ag—Pd | Rh/Ni |
| Example 6 | glass-ceramic | Ag | thick-film Ag—Pd | Ru/Ni |
| Example 7 | thick-film multilayer | Ag | thick-film Ag—Pd | Rh/Ni |
| Example 8 | thick-film multilayer | Ag | thick-film Ag—Pd | Ru/Ni |
| Comparative Example 1 | glass-ceramic | Cu | thin-film Cr/Pd | — |
| Comparative Example 2 | glass-ceramic | Ag | thin-film Cr/Pd | — |
| Comparative Example 3 | glass-ceramic | Cu | thick-film Cu | Ni |
| Comparative Example 4 | glass-ceramic | Ag | thick-film Ag—Pd | Ni |

| | Brazing Material | Heat Resistance (°C.) | 45° Pull-off Strength (kg/mm$^2$) |
| --- | --- | --- | --- |
| Example 1 | Ag—Cu | 750 | 2.8 |
| Example 2 | Ag—Cu | 750 | 1.5 |
| Example 3 | Ag—Cu | 750 | 2.6 |
| Example 4 | Ag—Cu | 750 | 1.9 |
| Example 5 | Ag—Cu | 750 | 4.3 |
| Example 6 | Ag—Cu | 750 | 4.0 |
| Example 7 | Ag—Cu | 750 | 2.9 |
| Example 8 | Ag—Cu | 750 | 1.7 |
| Comparative Example 1 | Au—Sn | 250 | 0.6 |
| Comparative Example 2 | Au—Sn | 250 | 0.7 |
| Comparative Example 3 | Ag—Cu | 250 | 0.3 |
| Comparative Example 4 | Ag—Cu | 250 | 0.2 |

As has been described above, according to the present invention, a joining member constituted between a metal or an alloy and a low-temperature sintered board such as a low-cost high-strength glass-ceramic board can be obtained. In addition, since an joining operation using a Ag—Cu-based eutectic brazing material can be performed at a high temperature, the degree of freedom of temperature control in the sequential processes can be increased.

An element joining pad structure for a semiconductor device mounting board according to the present invention is used as a useful joining structure for a semiconductor device such as an LSI mounted on an insulating board, a multilayered wiring board, a semiconductor package, or the like. Therefore, the industrial value of the element joining pad structure according to the present invention is very high.

What is claimed is:

1. An element joining pad for a semiconductor device mounting board, comprising:

a thick-film metalized layer selectively formed on a low-temperature sintered board and consisting of one of a metal and an alloy which can be sintered at not less than 500° C. and not more than 1,200° C.;

a barrier layer formed on said thick-film metalized layer and constituted by one of a Rh plating layer and a Ru plating layer; and a Ni plating layer formed on said barrier layer.

2. A pad according to claim 1, wherein said low-temperature sintered board is constituted by one of a glass-ceramic board and a thick-film multilayered board which can be sintered at a temperature of not more than 1,100° C.

3. A pad according to claim 1, wherein said thick-film metalized layer consists of one selected from the group consisting of Ag, Ag—Pd, Cu, and Au.

4. A pad according to claim 1, wherein said barrier layer prevents said Ni plating layer and said thick-film metalized layer from being diffused to each other during a brazing operation.

5. A pad according to claim 1, wherein a connection member, consisting of a metal including an alloy, to be connected to a semiconductor device is joined on said Ni plating layer with a brazing material having a melting point of not less than 500° C. and not more than 1,000° C.

6. A pad according to claim 5, wherein said barrier layer suppresses stress transmission from said brazing material to said thick-film metalized layer during a brazing operation.

7. An element joining pad for a semiconductor device mounting board, comprising:

a thick-film metalized layer selectively formed on a low-temperature sintered board and consisting of one of a metal and an alloy which can be sintered at not less than 500° C. and not more than 1,200° C.;

a metal plating layer formed on said thick-film metalized layer; and a barrier layer formed between said thick-film metalized layer and said metal plating layer, said barrier layer being formed of a metal material of high solidity and with a low thermal expansion ratio that prevents said thick film from being exfoliated during a brazing operation and for preventing said thick-film metalized layer and said metal plating layer from being diffused into each other during a brazing operation.

8. An element joining pad for a semiconductor device mounting board, comprising:

a thick-film metalized layer selectively formed on a low-temperature sintered board and consisting of one of a metal and an alloy which can be sintered at not less than 500° C. and not more than 1,200° C.;

a metal plating layer formed on said thick-film metalized layer;

said metal plating layer being constituted by a Ni plating layer, and a barrier layer, formed between said thick-film metalized layer and said metal plating layer, for preventing said thick-film metalized layer and said metal plating layer from being diffused to each other, said barrier layer being constituted by one of a Rh plating layer and a Ru plating layer.

9. A pad according to claim 8, further comprising wherein a connection member comprising a metal including an alloy for making a connection to a semiconductor device, said connection member being joined on said metal plating layer by a brazing material having a melting point of not less than 500° C. and not more than 1,000° C.

* * * * *